(12) United States Patent
Fang et al.

(10) Patent No.: US 11,037,801 B2
(45) Date of Patent: Jun. 15, 2021

(54) FABRICATION METHODS OF PATTERNED METAL FILM LAYER, THIN FILM TRANSISTOR AND DISPLAY SUBSTRATE

(71) Applicant: BOE TECHNOLOGY GROUP CO., LTD., Beijing (CN)

(72) Inventors: Jingang Fang, Beijing (CN); Luke Ding, Beijing (CN); Jun Liu, Beijing (CN); Wei Li, Beijing (CN); Yang Zhang, Beijing (CN); Leilei Cheng, Beijing (CN); Dongfang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/657,062

(22) Filed: Oct. 18, 2019

(65) Prior Publication Data
US 2020/0126809 A1 Apr. 23, 2020

(30) Foreign Application Priority Data
Oct. 22, 2018 (CN) .......................... 201811230086.1

(51) Int. Cl.
*H01L 21/32* (2006.01)
*H01L 21/02* (2006.01)
(Continued)

(52) U.S. Cl.
CPC .... *H01L 21/32139* (2013.01); *H01L 21/0274* (2013.01); *H01L 21/2855* (2013.01);
(Continued)

(58) Field of Classification Search
CPC .......... H01L 21/32139; H01L 21/0274; H01L 21/28079; H01L 21/28088; H01L 21/2855;
(Continued)

(56) References Cited

U.S. PATENT DOCUMENTS 9,508,808 B2 11/2016 Wang et al.
9,551,937 B2 1/2017 Di et al.
(Continued)

FOREIGN PATENT DOCUMENTS

CN  101093364 A  12/2007
CN  103715096 A  4/2014
(Continued)

OTHER PUBLICATIONS

First Office Action dated Mar. 24, 2020, for corresponding Chinese application 201811230086.1.

*Primary Examiner* — Sheikh Maruf
(74) *Attorney, Agent, or Firm* — Nath, Goldberg & Meyer; Joshua B. Goldberg

(57) ABSTRACT

A fabrication method of a patterned metal film layer, including: sequentially depositing a first metal layer and a photoresist on a substrate; forming a first patterned photoresist in the photoresist retaining area; etching the first metal layer, and removing a part of the first metal layer having a first thickness and located in an edge area of the photoresist retaining area and in the photoresist removing area, to form a second metal layer; processing the first patterned photoresist to form a second patterned photoresist; etching and removing a part, which is not in contact with the second patterned photoresist, of the second metal layer on the substrate to form a patterned metal film layer.

15 Claims, 2 Drawing Sheets

(51) Int. Cl.
*H01L 21/3213* (2006.01)
*H01L 21/027* (2006.01)
*H01L 21/28* (2006.01)
*H01L 21/285* (2006.01)

(52) U.S. Cl.
CPC .. *H01L 21/28079* (2013.01); *H01L 21/28088* (2013.01); *H01L 21/32134* (2013.01)

(58) Field of Classification Search
CPC ............ H01L 21/32134; H01L 27/124; H01L 21/0273; H01L 21/28008; H01L 29/401; H01L 29/6675
USPC ........................................................ 438/585
See application file for complete search history.

(56) References Cited

U.S. PATENT DOCUMENTS

| | | | |
|---|---|---|---|
| 9,905,592 B2 | 2/2018 | Su et al. | |
| 2003/0122987 A1* | 7/2003 | Kim | G02F 1/1368 349/43 |
| 2007/0082432 A1* | 4/2007 | Lee | H01L 27/1214 438/149 |
| 2008/0096332 A1* | 4/2008 | Lee | H01L 27/1288 438/151 |
| 2010/0112811 A1* | 5/2010 | Yeh | H01L 21/823828 438/669 |
| 2012/0171822 A1* | 7/2012 | Yuan | H01L 21/0274 438/166 |
| 2012/0289006 A1* | 11/2012 | Yuan | H01L 27/1288 438/158 |
| 2013/0043464 A1* | 2/2013 | Lu | H01L 29/7869 257/43 |
| 2014/0116863 A1* | 5/2014 | Lee | G06F 3/041 200/279 |
| 2015/0255558 A1* | 9/2015 | Nelson | H01L 29/42384 438/585 |
| 2015/0318362 A1* | 11/2015 | Wang | H01L 29/786 257/72 |
| 2016/0011457 A1* | 1/2016 | Zhang | H01L 27/1288 438/29 |
| 2016/0020105 A1* | 1/2016 | Clevenger | H01L 21/0337 438/585 |
| 2016/0049337 A1* | 2/2016 | Ando | H01L 21/324 438/585 |
| 2016/0163866 A1* | 6/2016 | Kim | H01L 21/02554 257/43 |
| 2016/0181159 A1* | 6/2016 | Whang | H01L 27/10873 438/585 |
| 2016/0202613 A1* | 7/2016 | Di | G03F 7/422 345/173 |
| 2016/0225710 A1* | 8/2016 | Hwang | H01L 27/10885 |
| 2016/0306225 A1* | 10/2016 | Zhang | H01L 27/1225 |
| 2017/0005099 A1* | 1/2017 | Lee | H01L 21/823475 |
| 2017/0110323 A1 | 4/2017 | An et al. | |
| 2017/0221924 A1* | 8/2017 | Su | H01L 29/66969 |
| 2017/0323893 A1* | 11/2017 | Kim | H01L 27/10814 |
| 2018/0175204 A1* | 6/2018 | Wang | H01L 29/7869 |
| 2019/0267372 A1* | 8/2019 | Wen | H01L 27/0207 |

FOREIGN PATENT DOCUMENTS

| | | |
|---|---|---|
| CN | 104536614 A | 4/2015 |
| CN | 105304478 A | 2/2016 |
| CN | 105529274 A | 4/2016 |
| CN | 106898578 A | 6/2017 |
| CN | 107768241 A | 3/2018 |
| CN | 107785308 A | 3/2018 |

* cited by examiner

US 11,037,801 B2

FABRICATION METHODS OF PATTERNED METAL FILM LAYER, THIN FILM TRANSISTOR AND DISPLAY SUBSTRATE

CROSS-REFERENCE TO RELATED APPLICATION

This application claims the benefit of priority to Chinese Patent Application No. 201811230086.1 filed on Oct. 22, 2018, the contents of which are incorporated herein in their entirety by reference.

TECHNICAL FIELD

The present disclosure belongs to the field of display technology, and particularly relates to fabrication methods of a patterned metal film layer, a thin film transistor and a display substrate.

BACKGROUND

An inorganic insulating layer in a display substrate may be made of silicon nitride, silicon oxide, or the like. Silicon nitride is likely to cause color shift in the display substrate, and thus silicon dioxide ($SiO_2$) is generally used as a material of an inorganic insulating layer. In order to reduce line resistance and voltage drop while ensuring an aperture ratio, copper (Cu) having relatively high conductivity is generally used as an electrode material in the display substrate.

SUMMARY

In one aspect, the present disclosure provides a fabrication method of a patterned metal film layer, including:

sequentially depositing a first metal layer and a photoresist on a substrate, and exposing the photoresist to form a photoresist retaining area and a photoresist removing area;

removing the photoresist in the photoresist removing area to form a first patterned photoresist in the photoresist retaining area;

etching the first metal layer, and removing a part of first metal layer having a first thickness and located in an edge area of the photoresist retaining area and in the photoresist removing area, to form a second metal layer;

processing the first patterned photoresist to form a second patterned photoresist such that an edge of the second metal layer in a middle area of the photoresist retaining area is separated from the second patterned photoresist; and etching and removing a part, which is not contacted with the second patterned photoresist, of the second metal layer on the substrate to form a patterned metal film layer.

According to an embodiment of the present disclosure, processing the first patterned photoresist to form the second patterned photoresist includes:

placing the first patterned photoresist in a developing solution for a first time so that the developing solution corrodes and removes a part of the first patterned photoresist, and the edge of the second metal layer in the middle area of the photoresist retaining area is separated from the second patterned photoresist, wherein the developing solution does not chemically react with the second metal layer.

According to an embodiment of the present disclosure, the developing solution is an alkaline developing solution.

According to an embodiment of the present disclosure, the alkaline developing solution includes tetramethylammonium hydroxide or potassium hydroxide.

According to an embodiment of the present disclosure, forming the second metal layer includes:

removing the part of first metal layer having the first thickness and located in the edge area of the photoresist retaining area and in the photoresist removing area by a wet etching process.

According to an embodiment of the present disclosure, forming the patterned metal film layer includes:

removing, by a wet etching process, a part of the second metal layer on the substrate having the first thickness and not in contact with the second patterned photoresist and a part of the second metal layer in the photoresist removing area, to form the patterned metal film layer.

According to an embodiment of the present disclosure, forming the first metal layer on the substrate includes:

depositing and forming the first metal layer on the substrate by a sputtering process.

According to an embodiment of the present disclosure, the first metal layer includes copper and/or a lamination of copper and molybdenum niobium target material (MoNb).

In another aspect, the present disclosure provides a method for fabricating a thin film transistor, including steps of forming a gate electrode, a source electrode and a drain electrode, wherein the step of forming the gate electrode includes the fabrication method of the patterned metal film layer according to an embodiment of the present disclosure.

According to an embodiment of the present disclosure, the steps of forming the source electrode and the drain electrode include the fabrication method of the patterned metal film layer according to an embodiment of the present disclosure.

According to an embodiment of the present disclosure, the method further includes:

a step of forming an interlayer insulating layer after the step of forming the gate electrode; and a step of forming a passivation layer after the steps of forming the source electrode and drain electrode.

According to an embodiment of the present disclosure, a material of the interlayer insulating layer includes silicon dioxide, and a material of the passivation layer includes silicon dioxide.

In another aspect, the present disclosure provides a fabrication method of a display substrate, including the fabrication method of the thin film transistor according to an embodiment of the present disclosure.

DETAILED DESCRIPTION

In order to enable a person skilled in the art to better understand the technical solution of the present disclosure, the present disclosure will be described in further detail below with reference to the accompanying drawings and the specific embodiments.

When an inorganic insulating layer such as $SiO_2$ is formed on a metal layer such as Cu, since the etching angle of Cu is relatively large, it is likely that the film thickness at the edge of the $SiO_2$ film layer is too small or the quality of the film layer at the edge of the $SiO_2$ film layer is poor, which leads to the occurrence of copper diffusion during subsequent high-temperature processes. In addition, when a display substrate including a thin film transistor is manufactured, a short circuit is easily caused between a gate electrode and a source/drain electrode, which leads to a reduced yield of the display substrate.

In the actual fabrication process, the photoresist has a good adhesion to Cu, so that the Cu on the top is not easy to be etched, and thus the etching angle is large. In the related art, the etching angle is improved by developing a new Cu etching solution, which mainly depends on manufacturers supplying the etching solution. Therefore, the development period may be long, the production cost may be increased, and the production efficiency may be reduced.

As shown in FIGS. 1 to 4, the present embodiment provides a method for fabricating a patterned metal film layer, which may be used to fabricate a patterned metal film layer in a device such as a thin film transistor in a display substrate.

The fabrication method of the patterned metal film layer includes the following steps S11 to S14.

In step S11, a first metal layer 2a and a photoresist are sequentially deposited on a substrate 1, and the photoresist is exposed to form a photoresist retaining area R and a photoresist removing area U; and the photoresist in the photoresist removing area U is removed, to form a first patterned photoresist 3 in the photoresist retaining area R.

According to an embodiment of the present disclosure, the substrate 1 may be a transparent substrate 1 with a thickness of 50 μm to 1000 μm. The material of the substrate may be Corning glass, glass made by Asahi Glass, quartz glass, etc. The first metal layer 2a may include at least one of copper and a lamination of copper and molybdenum niobium target material (MoNb). For example, the first metal layer 2a may be a signal layer of metal material, or may be multiple layers of metal material stacked with each other. The photoresist may be a positive photoresist or a negative photoresist, which is not limited herein.

Figure 1:
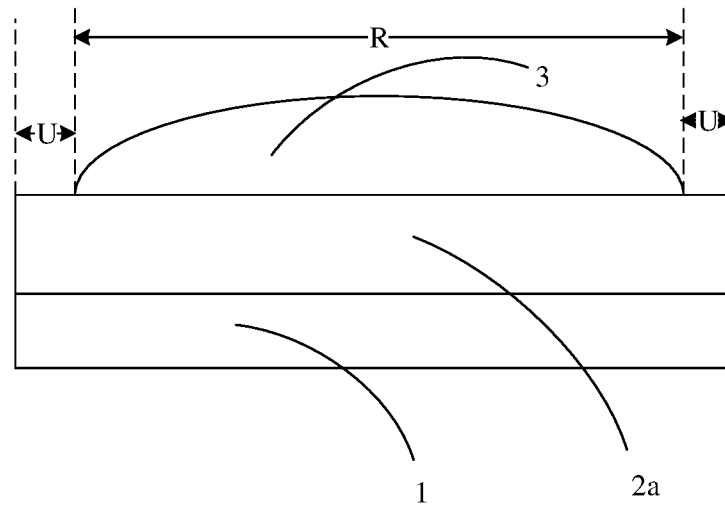
FIG. 1 is a schematic diagram illustrating a step of forming a first patterned photoresist in a photoresist retaining area in a fabrication method of a patterned metal film layer according to an embodiment of the disclosure.

According to an embodiment of the present disclosure, as shown in FIG. 1, in step S11, the first metal layer 2a having a thickness of 200 nm to 1000 nm and in the form of a whole layer may be deposited on the substrate 1 by a sputtering process, a whole layer of photoresist may be formed on the first metal layer 2a by a coating process, and then a first patterned photoresist 3 may be formed by a photolithography process.

In step S12, the first metal layer 2a on the substrate 1 subjected to the previous step is etched, and a part of first metal layer 2a having a first thickness and located in an edge area RE of the photoresist retaining area R and in the photoresist removing area U is removed.

In this embodiment, the first metal layer 2a is etched twice to finally form the patterned metal film layer 2c. A first etching is performed on the first metal layer 2a in step S12. According to an embodiment of the present disclosure, in step S12, the part of first metal layer 2a having the first thickness and located in the edge area RE of the photoresist retaining area R and in the photoresist removing area U is removed by a wet etching process, to obtain the second metal layer 2b.

Figure 2:
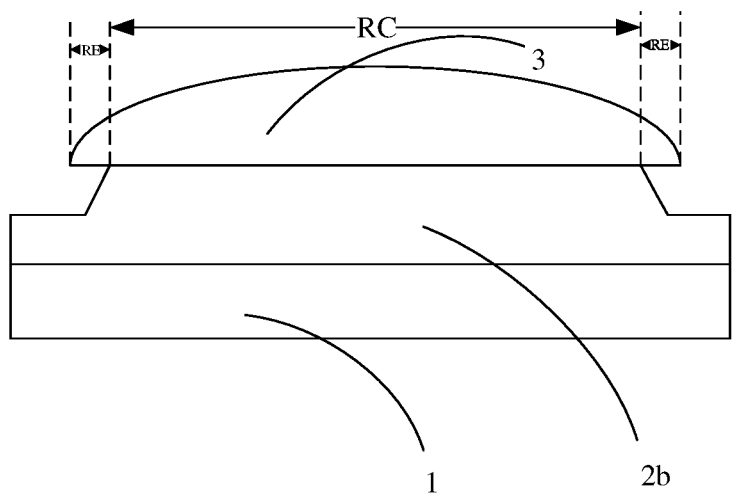
FIG. 2 is a schematic diagram illustrating a step of forming a second metal layer in a fabrication method of a patterned metal film layer according to an embodiment of the disclosure.

As shown in FIG. 2, in an embodiment, the substrate 1 subjected to step S11 may be placed in a container accommodating an etching solution, in which the etching solution can react with the first metal layer 2a. A part of the first metal layer 2a with a certain thickness on the substrate 1 can be removed by controlling the material of the etching solution and the etching time. According to an embodiment of the present disclosure, since the first patterned photoresist 3 is formed on the first metal layer 2a, theoretically only part of the first metal layer 2a located in the photoresist removing area U is removed in the etching process. However in the actual process, the etching solution also removes a part of the first metal layer 2a located in the edge area RE of the photoresist retaining area R, thereby forming the second metal layer 2b as shown in FIG. 2 where the first patterned photoresist 3 at the middle area RC of the photoresist retaining area R is in contact with the second metal layer 2b, and the first patterned photoresist 3 at the edge area RE of the photoresist retaining area R is not in contact with the second metal layer 2b. In an embodiment, the middle area RC of the photoresist retaining area R may be an area other than the edge area RE in the photoresist retaining area R.

In step S13, the first patterned photoresist 3 is processed to form a second patterned photoresist 4, such that an edge of the second metal layer 2b located in the middle area RC of the photoresist retaining area R is separated from the second patterned photoresist 4.

Figure 3:
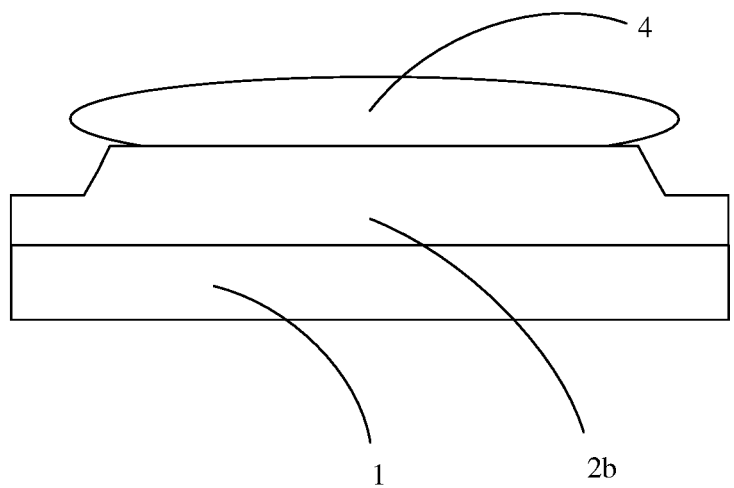
FIG. 3 is a schematic diagram of forming a second patterned photoresist in a fabrication method of a patterned metal film layer according to an embodiment of the disclosure.

As shown in FIG. 3, in step S13, a part of the first patterned photoresist 3 is removed by processing the first patterned photoresist 3, such that an edge of a side of the second metal layer 2b away from the substrate 1 (in this embodiment, the side of the second metal layer 2b away from the substrate 1 refers to an area of the first metal layer 2a which is away from the substrate 1 and is not etched in step S12) is separated from the second patterned photoresist 4, thereby reducing a contact area between the metal material and the photoresist in comparison with the case in step S11. In this case, an orthographic projection of the second patterned photoresist 4 on the substrate 1 may cover an orthographic projection of the side of the second metal layer 2b away from the substrate 1 on the substrate 1.

According to an embodiment of the present disclosure, step S13 may be implemented by the following method. The first patterned photoresist 3 is placed in a pre-formed developing solution for a predetermined time to be etched, so as to remove a part of the first patterned photoresist 3 and obtain the second patterned photoresist 4, and to separate an edge of the second metal layer 2b located in the middle area RC of the photoresist retaining area R from the obtained second patterned photoresist 4. The pre-formed developing solution does not react with the second metal layer 2b.

When the first patterned photoresist 3 is processed by using the developing solution, since the developing solution reacts only with the first patterned photoresist 3 and does not react with the second metal layer 2b, in step S13, a part of the second metal layer 2b previously in contact with the first patterned photoresist 3 will be exposed while the developing solution removes a part of the first patterned photoresist 3. Therefore, by controlling the material of the developing solution and the reaction time with the first patterned photoresist 3, the edge of the side of the second metal layer 2b away from the substrate 1 can be separated from the obtained second patterned photoresist 4, thereby exposing the edge of the side of the second metal layer 2b away from the substrate 1.

In an embodiment, the pre-formed developing solution used in this step is an alkaline developing solution. In general, the second metal layer 2b does not react with an alkaline developing solution, ph of which is greater than 7, and therefore an alkaline developing solution capable of removing the photoresist can be used in this embodiment. According to an embodiment of the present disclosure, the alkaline developing solution includes tetramethylammonium hydroxide or potassium hydroxide, and may be other substances capable of removing the photoresist, which will not be listed herein.

In step S14, a part of the second metal layer 2b, which is not in contact with the second patterned photoresist 4, on the substrate 1 is etched and removed to form a patterned metal film layer 2c.

Figure 4:
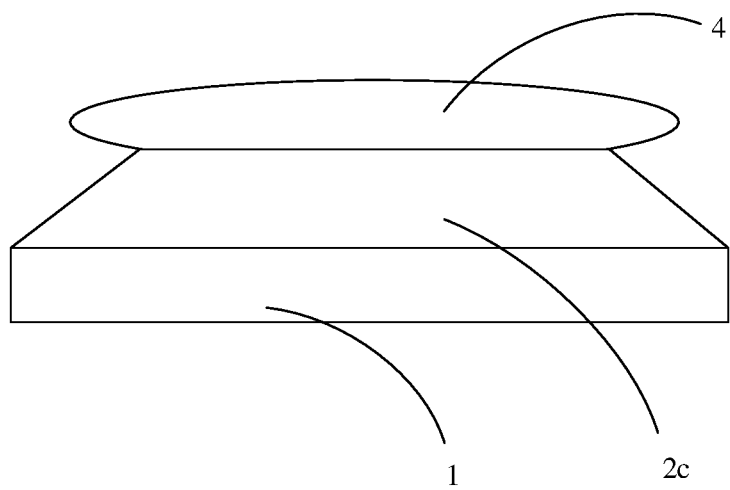
FIG. 4 is a schematic diagram of forming a patterned metal film layer in a fabrication method of a patterned metal film layer according to an embodiment of the disclosure.

As shown in FIG. 4, in step S14, when the second metal layer 2b is etched (i.e., a second etching is performed on the first metal layer 2a), the metal material, which is not in contact with the second patterned photoresist 4, in the second metal layer 2b on the substrate 1 is removed by a wet etching process, so as to form the patterned metal film layer 2c. In an embodiment, a part of metal material, not in contact with the second patterned photoresist 4, in the part of the second metal layer 2b having the first thickness (i.e., an upper part of the second metal layer 2b) is removed, and a part of the metal material, which is not in contact with the substrate 1 and is located in the photoresist removing area U, in the lower part of the second metal layer 2b is removed. In an embodiment of the disclosure, when the second metal layer 2b is etched, since the edge of the side of the second metal layer 2b away from the substrate 1 is exposed, the etching area is increased relative to the etching area in a case where the second etching is directly performed after step S12, so that the etching angle of the formed patterned metal film layer 2c can be relatively reduced.

Although not shown in FIGS. 2 to 4, it should be understood that the photoresist retaining area R and the photoresist removing area U described with reference to FIGS. 2 to 4 are located at the same positions as the photoresist retaining area R and the photoresist removing area U in FIG. 1. For example, the photoresist retaining area R described with reference to FIGS. 2 to 4 may be an area covered by the first patterned photoresist 3, and the photoresist removing area U described with reference to FIGS. 2 to 4 may be an area not covered by the first patterned photoresist 3. For example, the structure in the photoresist retaining area R may be a structure whose orthographic projection on the substrate 1 overlaps with an orthographic projection of the first patterned photoresist 3 on the substrate 1, and the structure in the photoresist removing area U may be a structure whose orthographic projection on the substrate 1 does not overlap with an orthographic projection of the first patterned photoresist 3 on the substrate 1.

Although not shown in FIGS. 3 and 4, it should be understood that the edge area RE and the middle areas RC of the photoresist retaining area R described with reference to FIGS. 3 and 4 are located at the same positions as the edge area RE and the middle area RC of the photoresist retaining area R in FIG. 2.

In the method for fabricating the patterned metal film layer 2c provided in the embodiment, a step of processing the photoresist (i.e., step of forming the second patterned photoresist 4 from the first patterned photoresist 3) is added to the two etching processes on the first metal layer 2a, so that the edge of the second metal layer 2b and the second patterned photoresist 4 contacted with each other are separated, and the edge of the side of the second metal layer 2b away from the substrate 1 is exposed. Therefore, the etching area is increased when the second metal layer 2b is etched, and the etching angle of the resultant patterned metal film layer 2c is decreased. Therefore, when an inorganic insulating layer is formed on the patterned metal film layer 2c, the inorganic insulating layer corresponding to the etching edge of the patterned metal film layer can have a thicker thickness and better film quality.

The embodiment of the disclosure provides a fabrication method of a thin film transistor, which includes steps of forming a gate electrode, a source electrode and a drain electrode.

In particular, the gate electrode and/or the source and drain electrodes in this embodiment are fabricated according to any one of the methods for fabricating the patterned metal film layer provided in the above embodiments.

By taking the fabrication of a bottom gate type thin film transistor as an example, in an embodiment, the fabrication method of the thin film transistor in this embodiment may include the following steps S21 to S25.

In step S21, a gate electrode is formed on a substrate.

According to an embodiment of the present disclosure, in step S21, the gate electrode may be formed by the method for fabricating the patterned metal film layer provided in the above embodiments, and for the steps and materials in the method, reference may be made to the above embodiments and detailed description thereof will not be given herein.

In step S22, an interlayer insulating layer is formed on the substrate subjected to the previous step.

According to an embodiment of the disclosure, in step S22, the interlayer insulating layer may be deposited and formed by a plasma enhanced chemical vapor deposition method, a low pressure chemical vapor deposition method, an atmospheric pressure chemical vapor deposition method, or an electron cyclotron resonance chemical vapor deposition method, with the material of silicon oxide, silicon nitride, or the like. For example, the material of the interlayer insulating layer may be silicon dioxide ($SiO_2$), so as to avoid a color shift in a display substrate to which the thin film transistor is applied. That is, the pattern of the gate electrode formed in the present embodiment may have a smaller etching angle, and/or the patterns of the source and drain electrodes formed may have a smaller etching angle.

In step S23, an active layer is formed on the substrate subjected to the previous step.

In an embodiment, in this step, an amorphous silicon film may be formed by a deposition process, and then is crystallized to form a polysilicon film. Then the polysilicon film is doped and is patterned to form a pattern including an active layer by one patterning process.

In step S24, source and drain electrodes are formed on the substrate subjected to the previous step.

Similar to step S21, the source and drain electrodes in this step can also be formed according to the method for fabricating the patterned metal film layer provided in the above embodiments. In an embodiment, the material of the source and drain electrodes may be copper.

In step S25, a passivation layer is formed on the substrate subjected to the previous step S24.

In this step, the passivation layer may be formed by the same process as the interlayer insulating layer in step S22, which will not be described in detail herein. In an embodiment, the material of the passivation layer may be silicon dioxide ($SiO_2$).

In the method for fabricating the thin film transistor provided in embodiments, the gate electrode, and the source and drain electrodes of the thin film transistor are fabricated by using the method for fabricating the patterned metal film layer provided in the above embodiments, so that the etching angles of the gate electrode, and the source and drain electrodes can be relatively small. Therefore, the structures such as the interlayer insulating layer and the passivation layer subsequently formed may have thicker thicknesses and better film quality at the positions corresponding to the etching edge of the metal film layer, thereby effectively avoiding the diffusion problem of metal materials in other subsequent high-temperature fabricating processes, and further improving the performance of the thin film transistor.

The present embodiment provides a method for fabricating a display substrate, including the method for fabricating the thin film transistor provided in the above embodiments.

Because the method for fabricating the display substrate of the embodiment includes the method for fabricating the thin film transistor provided in the embodiment, the performance of the thin film transistor of the display substrate fabricated by the method is better, so that the product performance of the display substrate is improved.

It can be understood that the above embodiments are merely exemplary embodiments used for illustrating the principle of the present disclosure, but the present disclosure is not limited thereto. For those skilled in the art, various modifications and improvements may be made without departing from the spirit and essence of the present disclosure, and these variations and improvements are also considered to be within the protection scope of the present disclosure.

The invention claimed is:

1. A fabrication method of a patterned metal film layer, comprising:
   sequentially depositing a first metal layer having a second thickness and a photoresist on a substrate, and exposing the photoresist to form a photoresist retaining area and a photoresist removing area;
   removing the photoresist in the photoresist removing area to form a first patterned photoresist in the photoresist retaining area;
   etching the first metal layer, and removing a part of first metal layer having a first thickness and located in an edge area of the photoresist retaining area and in the photoresist removing area, to form a second metal layer, wherein the first thickness is smaller than the second thickness, and the second metal layer has an uniform thickness;
   processing the first patterned photoresist to form a second patterned photoresist such that an edge of the second metal layer in a middle area of the photoresist retaining area is separated from the second patterned photoresist; and
   etching and removing a part, which is not in contact with the second patterned photoresist, of the second metal layer on the substrate to form a patterned metal film layer.

2. The fabrication method of claim 1, wherein processing the first patterned photoresist to form the second patterned photoresist comprises:
   placing the first patterned photoresist in a developing solution for a first time so that the developing solution corrodes and removes a part of the first patterned photoresist, and the edge of the second metal layer in the middle area of the photoresist retaining area is separated from the second patterned photoresist, wherein the developing solution does not chemically react with the second metal layer.

3. The fabrication method of claim 2, wherein the developing solution is an alkaline developing solution.

4. The fabrication method of claim 3, wherein the alkaline developing solution comprises tetramethylammonium hydroxide or potassium hydroxide.

5. The fabrication method of claim 1, wherein forming the second metal layer comprises:
   removing the part of first metal layer having the first thickness and located in the edge area of the photoresist retaining area and in the photoresist removing area by a wet etching process.

6. The fabrication method of claim 1, wherein forming the patterned metal film layer comprises:
   removing, by a wet etching process, a part of the second metal layer on the substrate having the first thickness and not in contact with the second patterned photoresist and a part of the second metal layer in the photoresist removing area, to form the patterned metal film layer.

7. The fabrication method of claim 1, wherein forming the first metal layer on the substrate comprises:
   depositing and forming the first metal layer on the substrate by a sputtering process.

8. The fabrication method of claim 1, wherein the first metal layer comprises copper and/or a lamination of copper and molybdenum niobium target material (MoNb).

9. A fabrication method of a thin film transistor, comprising steps of forming a gate electrode, a source electrode and a drain electrode, wherein
   the step of forming the gate electrode comprises the fabrication method of claim 1.

10. A fabrication method of a thin film transistor, comprising steps of forming a gate electrode, a source electrode and a drain electrode, wherein
    the steps of forming the source electrode and the drain electrode comprise the fabrication method of claim 1.

11. A patterned metal film layer, wherein the patterned metal film layer is fabricated by the fabrication method of claim 1.

12. A fabrication method of a thin film transistor, comprising steps of forming a gate electrode, a source electrode and a drain electrode, wherein
    the steps of forming the gate electrode, the source electrode and the drain electrode each comprise the fabrication method of claim 1.

13. The fabrication method of claim 12, further comprising:
    a step of forming an interlayer insulating layer after the step of forming the gate electrode; and
    a step of forming a passivation layer after the step of forming the source electrode and drain electrode.

14. The fabrication method of claim 13, wherein a material of the interlayer insulating layer comprises silicon dioxide, and
    a material of the passivation layer comprises silicon dioxide.

15. A fabrication method of a display substrate, comprising the fabrication method of claim 9.

* * * * *